United States Patent
Chien

(10) Patent No.: US 9,063,519 B2
(45) Date of Patent: Jun. 23, 2015

(54) TIME-TO-DIGITAL CONVERTER AND RELATED METHOD

(71) Applicant: Taiwan Semiconductor Manufacturing Company, Ltd., Hsin-Chu (TW)

(72) Inventor: Jinn-Yeh Chien, Chu Bei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 7 days.

(21) Appl. No.: 13/973,504

(22) Filed: Aug. 22, 2013

(65) Prior Publication Data
US 2015/0054667 A1 Feb. 26, 2015

(51) Int. Cl.
*G04F 10/00* (2006.01)
*H03M 1/12* (2006.01)
*H03K 5/13* (2014.01)

(52) U.S. Cl.
CPC ........... *G04F 10/005* (2013.01); *H03M 1/1205* (2013.01); *H03K 5/133* (2013.01)

(58) Field of Classification Search
CPC ..................................... G04F 10/005
USPC .......... 341/111, 166; 327/147, 150, 152, 153, 327/231, 234, 235, 261, 263, 264, 291, 295, 327/296, 269–271; 331/1 A
See application file for complete search history.

(56) References Cited

U.S. PATENT DOCUMENTS

| | | | | |
|---|---|---|---|---|
| 5,835,552 A * | 11/1998 | Kusumoto et al. | ............... | 377/24 |
| 2004/0239546 A1* | 12/2004 | Watanabe et al. | ............. | 341/157 |
| 2006/0022734 A1* | 2/2006 | Huang et al. | .................. | 327/231 |
| 2008/0315959 A1* | 12/2008 | Zhuang et al. | ................... | 331/17 |
| 2009/0296532 A1* | 12/2009 | Hsieh | ............................. | 368/120 |
| 2011/0248757 A1* | 10/2011 | Jalan et al. | ..................... | 327/161 |
| 2012/0112841 A1* | 5/2012 | Hayashi | ............................ | 331/2 |
| 2013/0214959 A1* | 8/2013 | Lee | ................................ | 341/166 |

* cited by examiner

*Primary Examiner* — Howard Williams
(74) *Attorney, Agent, or Firm* — Slater & Matsil, L.L.P.

(57) ABSTRACT

A device includes a delay line, a first readout circuit electrically connected to the delay line, a second readout circuit electrically connected to the delay line, and a phase interpolator electrically connected to the second readout circuit.

19 Claims, 9 Drawing Sheets

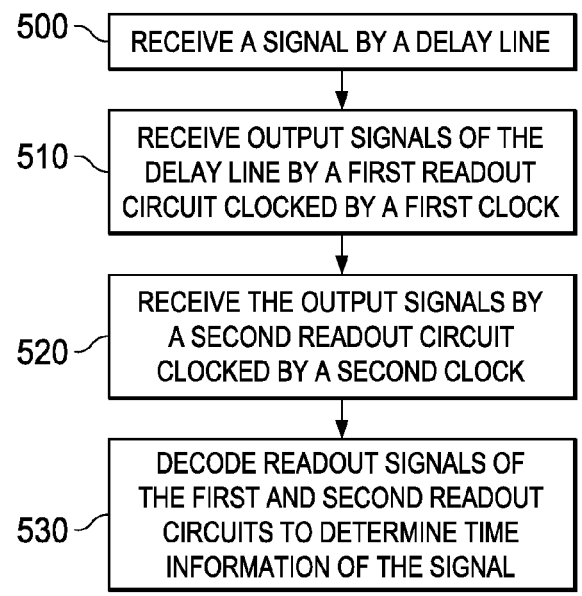
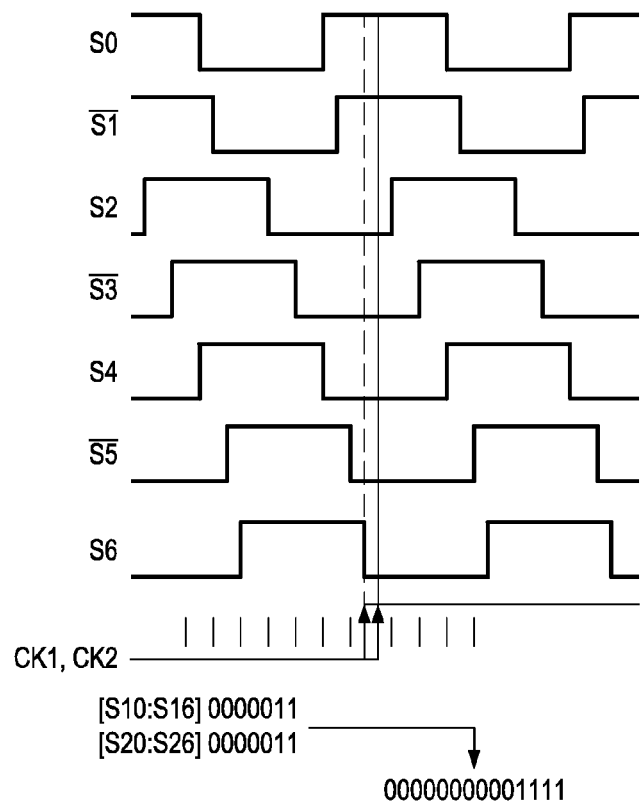

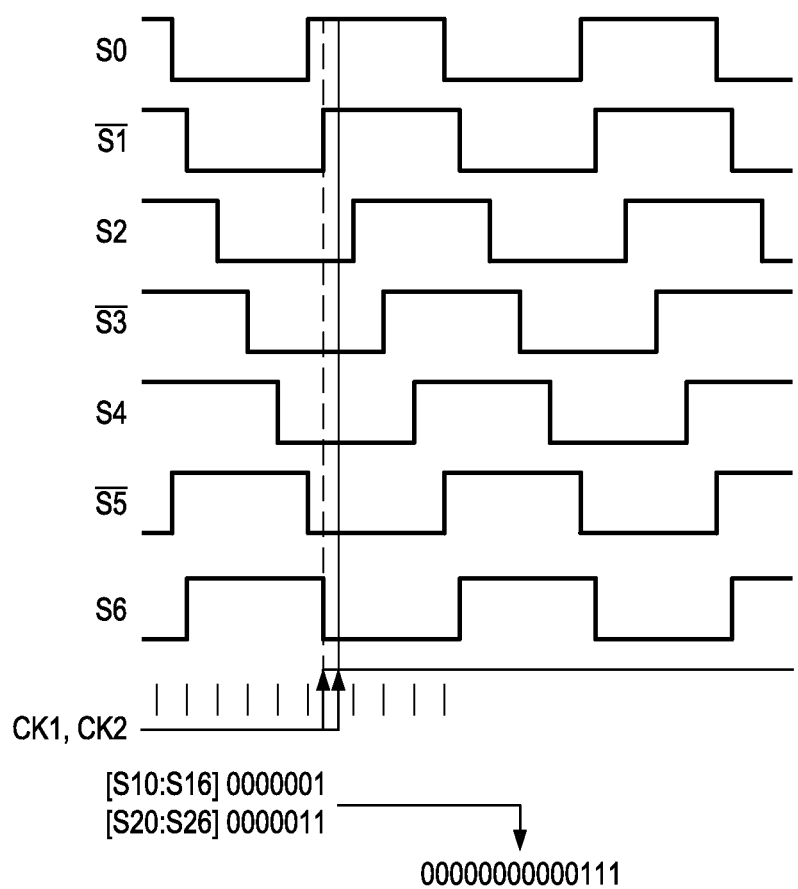

TIME-TO-DIGITAL CONVERTER AND RELATED METHOD

BACKGROUND

The semiconductor industry has experienced rapid growth due to improvements in the integration density of a variety of electronic components (e.g., transistors, diodes, resistors, capacitors, etc.). For the most part, this improvement in integration density has come from shrinking the semiconductor process node (e.g., shrinking the process node towards the sub-20 nm node).

A shift to all-digital phase-locked loops (ADPLLs) has accompanied the shrinking of the semiconductor process node. The ADPLL replaces analog components of analog PLLs with digital components, and in some cases, adopts a different architecture completely. One component common to many ADPLL architectures is a time-to-digital converter, or TDC. The TDC converts time information to a coded digital signal. In general, doubling TDC resolution can improve phase noise of the ADPLL by 6 dbC/Hz. Improved resolution also increases jitter measurement circuit accuracy.

BRIEF DESCRIPTION OF THE DRAWINGS

For a more complete understanding of the present embodiments, and the advantages thereof, reference is now made to the following descriptions taken in conjunction with the accompanying drawings, in which:

FIG. 5 is a flowchart of a method for digitizing time delay between two signals;

FIGS. 6-8 are exemplary waveform diagrams of signals of a delay line; and

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely time-to-digital converter (TDC) circuits and related methods. Other embodiments may also be applied, however, to other types of converter and/or delay line circuits.

Throughout the various figures and discussion, like reference numbers refer to like objects or components. Also, although singular components may be depicted throughout some of the figures, this is for simplicity of illustration and ease of discussion. A person having ordinary skill in the art will readily appreciate that such discussion and depiction can be and usually is applicable for many components within a structure.

In the following disclosure, a novel TDC circuit and method are introduced. The TDC circuit uses a phase interpolator to increase resolution of the TDC circuit beyond one inverter delay.

Figure 1:
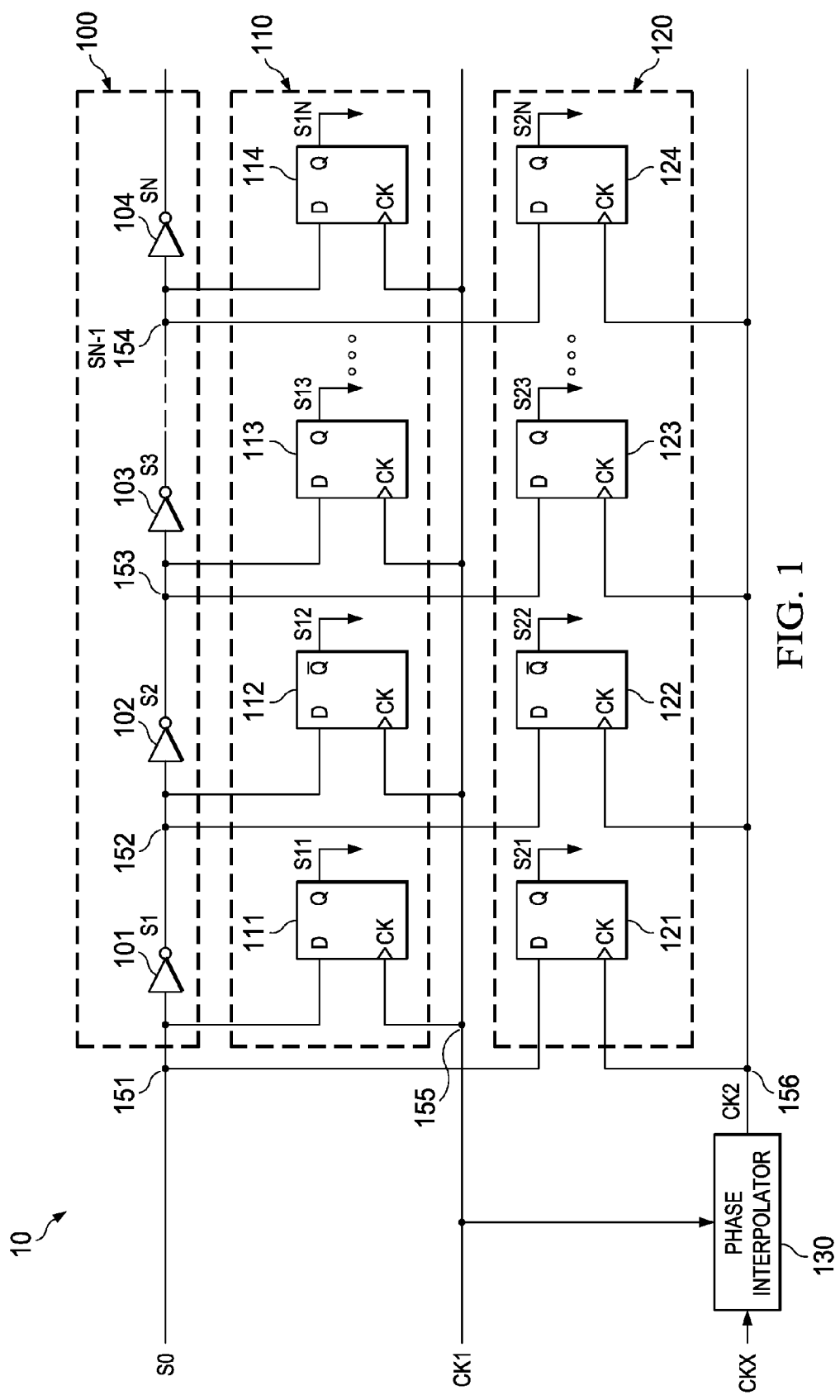
FIG. 1 is a diagram showing a TDC circuit in accordance with various embodiments of the present disclosure.

FIG. 1 is a diagram showing a TDC circuit 10 in accordance with various embodiments of the present disclosure. The TDC circuit 10 includes at least a delay line 100, a first readout circuit 110, a second readout circuit 120, and a phase interpolator 130. The delay line 100 receives an input signal S0 at a node 151, and outputs output signals S1, S2, ..., SN−1, SN. The first readout circuit 110 latches the output signals S1, S2, ..., SN−1, SN synchronously based on a first clock CK1 at a node 155. In some embodiments, the first clock CK1 is a periodic electrical signal having a first frequency.

The phase interpolator 130 generates a second clock CK2 at a node 156 based on the first clock CK1 and an interpolator clock CKX. The second readout circuit 120 latches the output signals S1, S2, ..., SN−1, SN synchronously between the first clock CK1 and the interpolator clock CKX based on the second clock CK2. In some embodiments, the first, second, and interpolator clocks CK1-CK2, CKX are electrical signals having alternating high and low periods occurring at first, second, and third ratios (duty cycles) and at first, second, and third frequencies, respectively. In some embodiments, the first, second and third frequencies are the same, and the first, second and third ratios are the same.

A first inverter 101 of the delay line 100 has an input terminal electrically connected to the node 151, and an output terminal electrically connected to a node 152. The first inverter 101 inverts the input signal S0 to generate a first signal S1 having opposite logical level of the input signal S0. For example, when the input signal S0 is logic low, the first signal S1 is logic high.

A second inverter 102 of the delay line 100 has an input terminal electrically connected to the node 152, and an output terminal electrically connected to a node 153. The second inverter 102 inverts the first signal S1 to generate a second signal S2 having opposite logical level of the first signal S1. For example, when the first signal S1 is logic high, the second signal S2 is logic low.

A third inverter 103 of the delay line 100 has an input terminal electrically connected to the node 153. The third inverter 103 inverts the second signal S2 to generate a third signal S3 having opposite logical level of the second signal S2. For example, when the second signal S1 is logic low, the third signal S3 is logic high.

An Nth inverter 104 of the delay line 100 has an input terminal electrically connected to a node 154. The Nth inverter 104 inverts (N−1)th signal SN−1 to generate an Nth signal SN having opposite logical level of the (N−1)th signal SN−1. For example, when the (N−1)th SN−1 is logic high, the Nth signal SN is logic low. Number N of the first through Nth inverters 101, 102, 103, ..., 104 may be designed to achieve an acceptable tradeoff between resolution, area, power consumption, and other desirable circuit performance parameters. Although shown having more than four inverters, embodiments in which the delay line 100 includes fewer than four inverters (e.g., three or two inverters) are also contemplated herein.

A first flip-flop 111 of the first readout circuit 110 is a D-type flip-flop, and has an input terminal (D), a non-inverting output terminal (Q), and a clock (or, "enable") terminal (CK). The input terminal of the first flip-flop 111 is electrically connected to the node 151. The clock terminal of the first flip-flop 111 is electrically connected to the node 155. A first output signal S11 generated by the first flip-flop 111 is read out from the non-inverting output terminal. In some embodiments, the output is read out from the inverting output terminal. In some embodiments, the first flip-flop 111 captures logical level (e.g., "high" or "low") of the input signal S0 at edges (e.g., rising edges) of the first clock CK1.

A second flip-flop 112 of the first readout circuit 110 is a D-type flip-flop, and has an input terminal (D), an inverting output terminal ($\overline{Q}$), and a clock (or, "enable") terminal (CK). The input terminal of the second flip-flop 112 is electrically connected to the node 152. The clock terminal of the second flip-flop 112 is electrically connected to the node 155. A second output signal S12 generated by the second flip-flop 112 is read out from the inverting output terminal. In some embodiments, the output is read out from the non-inverting output terminal. In some embodiments, the second flip-flop 112 captures logical level (e.g., "high" or "low") of the first signal S1 at edges (e.g., rising edges) of the first clock CK1.

A third flip-flop 113 of the first readout circuit 110 is a D-type flip-flop, and has an input terminal (D), a non-inverting output terminal (Q), and a clock (or, "enable") terminal (CK). The input terminal of the third flip-flop 113 is electrically connected to the node 153. The clock terminal of the third flip-flop 113 is electrically connected to the node 155. A third output signal S13 generated by the third flip-flop 113 is read out from the non-inverting output terminal. In some embodiments, the output is read out from the inverting output terminal. In some embodiments, the third flip-flop 113 captures logical level (e.g., "high" or "low") of the second signal S2 at edges (e.g., rising edges) of the first clock CK1.

An Nth flip-flop 114 of the first readout circuit 110 is a D-type flip-flop, and has an input terminal (D), a non-inverting output terminal (Q), and a clock (or, "enable") terminal (CK). The input terminal of the Nth flip-flop 114 is electrically connected to the node 154. The clock terminal of the second flip-flop 114 is electrically connected to the node 155. An Nth output signal SN generated by the Nth flip-flop 114 is read out from the non-inverting output terminal. In some embodiments, the output is read out from the inverting output terminal. In some embodiments, the second flip-flop 114 captures logical level (e.g., "high" or "low") of the (N−1)th signal SN−1 at edges (e.g., rising edges) of the first clock CK1. Number N of the first through Nth flip-flops 111, 112, 113, . . . , 114 may be the same as the number N of the first through Nth inverters 101, 102, 103, . . . , 104. Although shown having more than four flip-flops, embodiments in which the first readout circuit 110 includes fewer than four flip-flops (e.g., three or two flip-flops) are also contemplated herein.

A first flip-flop 121 of the second readout circuit 120 is a D-type flip-flop, and has an input terminal (D), a non-inverting output terminal (Q), and a clock (or, "enable") terminal (CK). The input terminal of the first flip-flop 121 is electrically connected to the node 151. The clock terminal of the first flip-flop 121 is electrically connected to the node 156. A first delayed output signal S21 generated by the first flip-flop 121 is read out from the non-inverting output terminal. In some embodiments, the output is read out from the inverting output terminal. In some embodiments, the first flip-flop 121 captures logical level (e.g., "high" or "low") of the input signal S0 at edges (e.g., rising edges) of the second clock CK2.

A second flip-flop 122 of the second readout circuit 120 is a D-type flip-flop, and has an input terminal (D), an inverting output terminal ($\overline{Q}$), and a clock (or, "enable") terminal (CK). The input terminal of the second flip-flop 122 is electrically connected to the node 152. The clock terminal of the second flip-flop 122 is electrically connected to the node 156. A second delayed output signal S22 generated by the second flip-flop 122 is read out from the inverting output terminal. In some embodiments, the output is read out from the non-inverting output terminal. In some embodiments, the second flip-flop 122 captures logical level (e.g., "high" or "low") of the first signal S1 at edges (e.g., rising edges) of the second clock CK2.

A third flip-flop 123 of the second readout circuit 120 is a D-type flip-flop, and has an input terminal (D), a non-inverting output terminal (Q), and a clock (or, "enable") terminal (CK). The input terminal of the third flip-flop 123 is electrically connected to the node 153. The clock terminal of the third flip-flop 123 is electrically connected to the node 156. A third output signal S23 generated by the third flip-flop 123 is read out from the non-inverting output terminal. In some embodiments, the output is read out from the inverting output terminal. In some embodiments, the third flip-flop 123 captures logical level (e.g., "high" or "low") of the second signal S2 at edges (e.g., rising edges) of the second clock CK2.

An Nth flip-flop 124 of the second readout circuit 120 is a D-type flip-flop, and has an input terminal (D), a non-inverting output terminal (Q), and a clock (or, "enable") terminal (CK). The input terminal of the Nth flip-flop 124 is electrically connected to the node 154. The clock terminal of the second flip-flop 124 is electrically connected to the node 156. An Nth output signal S2N generated by the Nth flip-flop 124 is read out from the non-inverting output terminal. In some embodiments, the output is read out from the inverting output terminal. In some embodiments, the second flip-flop 124 captures logical level (e.g., "high" or "low") of the (N−1)th signal SN−1 at edges (e.g., rising edges) of the second clock CK2. Number N of the first through Nth flip-flops 121, 122, 123, . . . , 124 may be the same as the number N of the first through Nth inverters 101, 102, 103, . . . , 104. Although shown having more than four flip-flops, embodiments in which the second readout circuit 120 includes fewer than four flip-flops (e.g., three or two flip-flops) are also contemplated herein.

Figure 2:
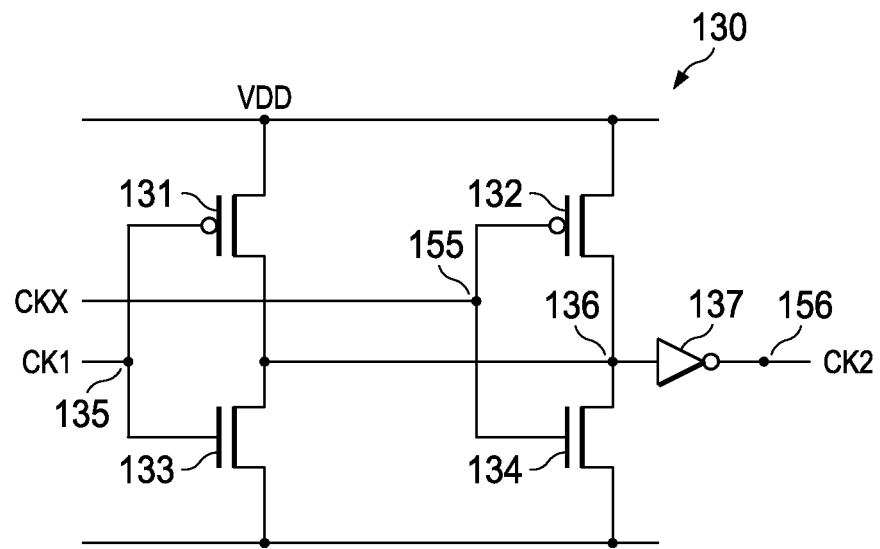
FIG. 2 is a diagram showing a phase interpolator in accordance with various embodiments of the present disclosure.
Figure 3:
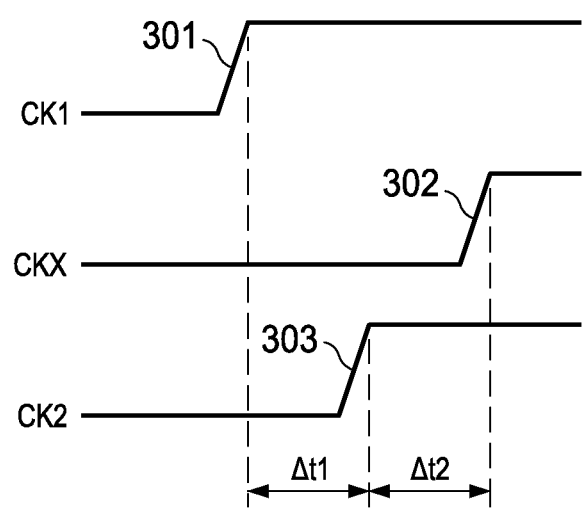
FIG. 3 is a waveform diagram showing operation of the phase interpolator in accordance with various embodiments of the present disclosure.

FIG. 2 is a diagram showing the phase interpolator 130 in accordance with various embodiments of the present disclosure. FIG. 3 is a waveform diagram showing operation of the phase interpolator 130 in accordance with various embodiments of the present disclosure. The phase interpolator 130 is configured to generate the second clock CK2 having edges between consecutive edges of the first clock CK1 and the interpolator clock CKX. Shown in FIG. 3, a third rising edge 303 of the interpolator clock CK2 is after a first rising edge 301 of the first clock CK1, and before a second rising edge 302 of the interpolator clock CKX. In some embodiments, time Δt1 between the first rising edge 301 and the third rising edge 303 is approximately equal to time Δt2 between the second rising edge 302 and the third rising edge 303. In some embodiments, the times Δt1, Δt2 are each substantially 50% of the time between the first rising edge 301 and the second rising edge 302.

Referring again to FIG. 2, a first inverter of the phase interpolator 130 includes a P-type transistor 131 and an N-type transistor 133. Gate electrodes of the P-type transistor 131 and the N-type transistor 133 are electrically connected to a node 135. Drain electrodes of the P-type transistor 131 and the N-type transistor 133 are electrically connected to a node 136. A second inverter of the phase interpolator 130 includes a P-type transistor 132 and an N-type transistor 134. Gate electrodes of the P-type transistor 132 and the N-type transistor 134 are electrically connected to the node 155.

Drain electrodes of the P-type transistor 132 and the N-type transistor 134 are electrically connected to the node 136. A third inverter 137 has an input terminal electrically connected to the node 136, and an output terminal electrically connected to the node 156.

The first clock CK1 is applied to the gate electrodes of the P-type transistor 131 and the N-type transistor 133 at the node 135. The interpolator clock CKX is applied to the gate electrodes of the P-type transistor 132 and the N-type transistor 134 at the node 155. The phase interpolator 130 outputs the second clock CK2 at the node 156.

Prior to the first rising edge 301, first voltage level of the first clock CK1 is low (e.g., 0 Volts), and second voltage level of the interpolator clock CKX is low (e.g., 0 Volts). The first voltage level being low turns off the N-type transistor 133, and turns on the P-type transistor 131. The second voltage level being low turns off the N-type transistor 134, and turns on the P-type transistor 132. With the P-type transistors 131, 132 turned on, voltage at the node 136 is pulled high, and voltage at the node 156 is pulled low by the third inverter 137.

During and after the first rising edge 301, the N-type transistor 133 is turned on, and the P-type transistor 131 is turned off. The voltage at the node 136 transitions from high to low at a speed determined at least by sizes (e.g., width/length ratios) of the P-type transistor 132 and the N-type transistor 133. The third inverter 137 inverts the transition from high to low at the node 136 to the third rising edge 303 at the node 156.

After the second rising edge 302, the N-type transistors 133, 134 are turned on, and the P-type transistors 131, 132 are turned off. The voltage at the node 136 is pulled completely low (e.g., to ground) by the N-type transistors 133, 134, and the voltage at the node 156 is pulled completely high (e.g., to an upper power supply voltage VDD) by the third inverter 137.

The architecture shown in FIG. 2 is only one type of phase interpolator. Embodiments using other architectures for the phase interpolator 130 are also contemplated herein.

Figure 4:
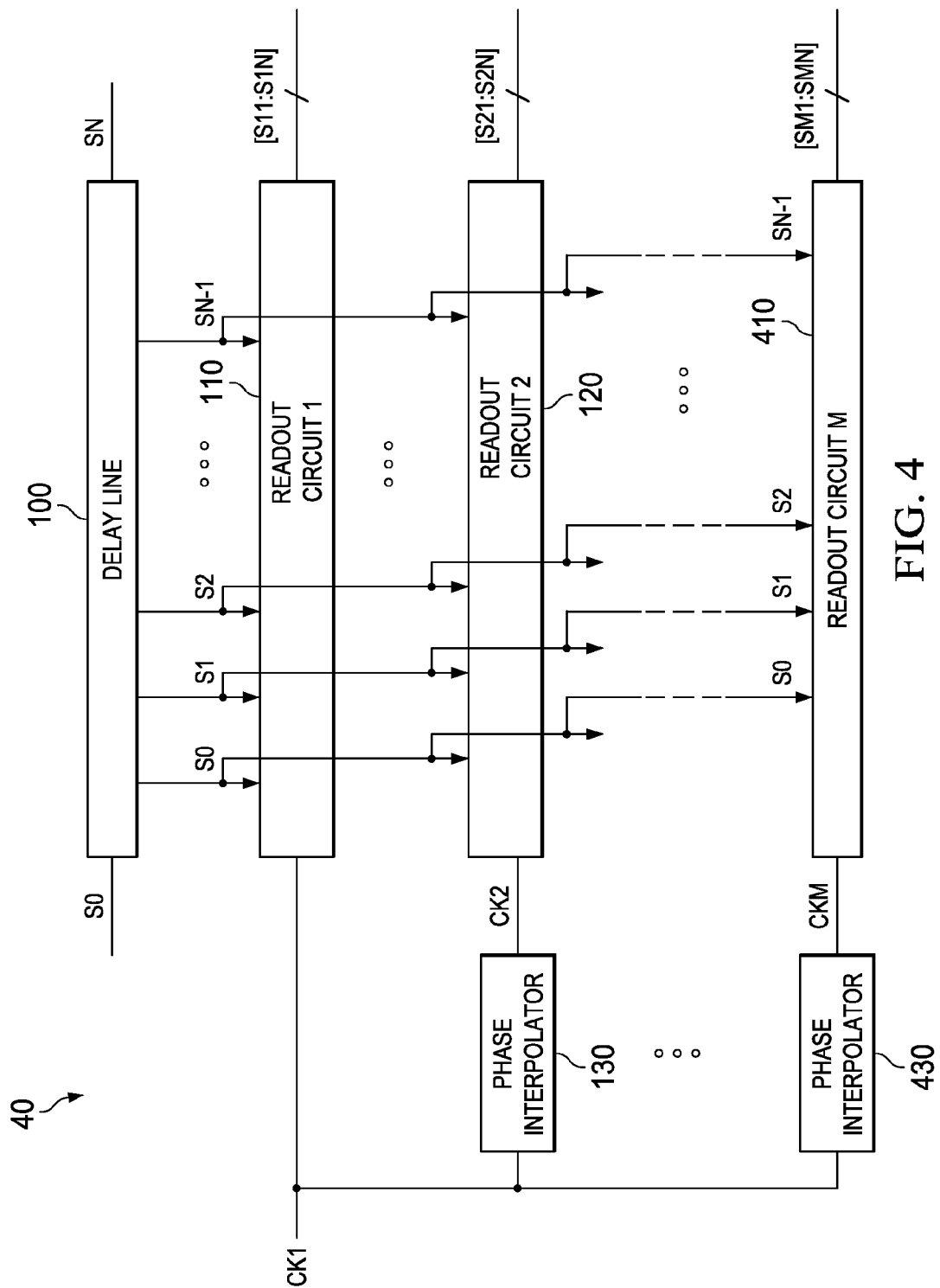
FIG. 4 is a diagram showing a TDC circuit in accordance with various embodiments of the present disclosure.

FIG. 4 is a diagram showing a TDC circuit 40 in accordance with various embodiments of the present disclosure. The TDC circuit 40 is similar in some respects to the TDC circuit 20 of FIG. 2, with like reference numerals representing similar components. The TDC circuit 20 includes M readout circuits 110, 120, . . . , 410. The first readout circuit 110 is clocked by the first clock CK1. The second readout circuit 120 is clocked by the second clock CK2. The Mth readout circuit 410 is clocked by an Mth clock CKM. The first to Mth clocks CK1, CK2, . . . , CKM have different phases. For example, for M=4, phases of the first to fourth clocks CK1, CK2, . . . , CK4 may be substantially 0%, 25%, 50%, and 75%, respectively. For M=3, phases of the first to third clocks CK1, CK2, CK3 may be substantially 0, T/3, and 2T/3, where T is delay between the first rising edge 301 and the second rising edge 302. Increasing M increases resolution of the TDC circuit 40. The Mth readout circuit 410 outputs N readout signals SM1, SM2, . . . , SMN.

In some embodiments, the Mth clock CKM is generated by an (M−1)th phase interpolator 430 similar to the phase interpolator 130. Taking the architecture shown in FIG. 2 as an example for illustration, P-type transistors of the (M−1)th phase interpolator 430 may have different size than the P-type transistors 131, 132 of the phase interpolator 130. In some embodiments, N-type transistors of the (M−1)th phase interpolator 430 have different size than the N-type transistors 133, 134 of the phase interpolator 130. This allows the (M−1)th phase interpolator 430 to generate the Mth clock CKM with different phase than the second clock CK2.

FIG. 5 is a flowchart of a method 50 for digitizing time delay between two signals. In some embodiments, the method 50 is performed by the TDC circuit 10 of FIG. 1 or the TDC circuit 40 of FIG. 4. A signal, such as the signal S0, is received 500 by a delay line, such as the delay line 100. In some embodiments, the signal is a clock. In some embodiments, the signal is generated based on a clock. The delay line outputs signals, such as the output signals S1-SN. In some embodiments, the output signals S1-SN correspond to number of inverter delays of the delay line. For example, the output signal S3 may correspond to three inverter delays, and the output signal S7 may correspond to seven inverter delays. The output signals are received 510 by a first readout circuit (e.g., the first readout circuit 110) clocked by a first clock (e.g., the first clock CK1). The first readout circuit receives the first clock, and captures the output signals on an edge (e.g., a rising edge) of the first clock. The output signals are received 520 by a second readout circuit (e.g., the second readout circuit 120) clocked by a second clock (e.g., the second clock CK2). In some embodiments, the second clock differs in phase from the first clock by less than one inverter delay. In some embodiments, further readout circuits clocked by further clocks (such as in the TDC circuit 40) receive the output signals. In some embodiments, the second clock is generated by a phase interpolator based on the first clock and an interpolator clock. Readout signals of the first and second readout circuits (e.g., the output signals S11-S1N, S21-S2N) are decoded 530 to determine time information of the signal. In some embodiments, the time information is the time delay between the signal and a reference clock.

Figure 8:
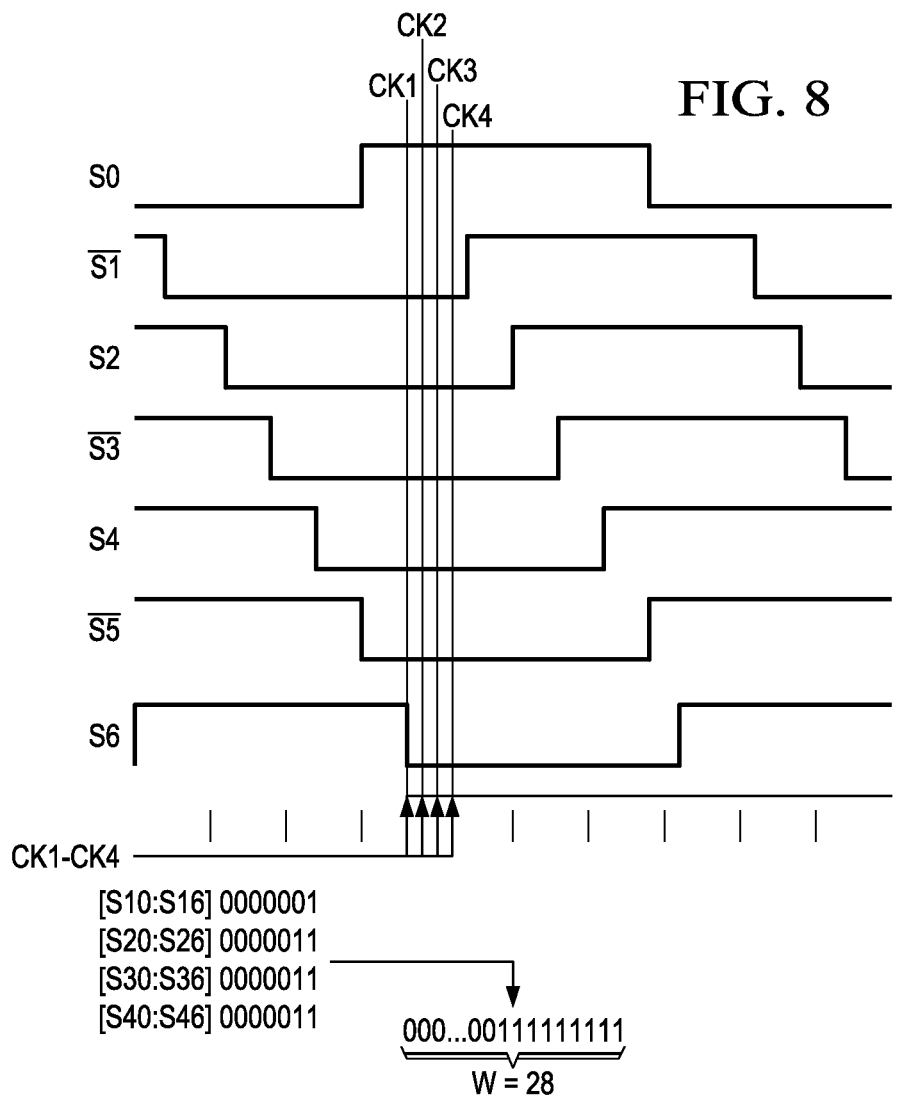

FIGS. 6-8 are exemplary waveform diagrams of the signals S0-S6 of the delay line 100. Odd signals (e.g., S1, S3, S5) of the signals S0-S6 are shown barred as an aid to the reader. In the examples shown in FIGS. 6-8, the inverters 101, 102, 103, . . . , 104 of the delay line 100 number six. FIGS. 6 and 7 are examples of waveforms of the TDC circuit 10 of FIG. 1. FIG. 8 is an example of the TDC circuit 40 of FIG. 4 for four readout circuits and four clocks CK1-CK4. Referring to FIG. 6, at the rising edge of the first clock CK1 (shown by an arrow and dotted line), the input signal S0 and the first signal S1 are at high voltage, whereas the second through sixth signals S2-S6 are at low voltage ([S10:S16]="0000011"). At the rising edge of the second clock CK2 (shown by an arrow and a solid line), the input signal S0 and the first signal S1 are at high voltage, whereas the second through sixth signals S2-S6 are at low voltage ([S20:S26]="0000011"). Using the method 50, the output signals S10-S16, S20-S26 are decoded to form a decoder signal having value "00000000001111". The decoder signal has double the resolution of the output signals S10-S16 read out by the first readout circuit 110 due to insertion of the output signals S20-S26 read out by the second readout circuit 120.

In another example shown in FIG. 7, at the rising edge of the first clock CK1 (shown by an arrow and dotted line), the input signal S0 is at high voltage, whereas the first through sixth signals S1-S6 are at low voltage ([S10:S16]="0000001"). At the rising edge of the second clock CK2 (shown by an arrow and a solid line), the input signal S0 and the first signal S1 are at high voltage, whereas the second through sixth signals S2-S6 are at low voltage ([S20:S26]="0000011"). Using the method 50, the output signals S10-S16, S20-S26 are decoded to form a decoder signal having value "00000000000111". The decoder signal has double the resolution of the output signals S10-S16 read out by the first readout circuit 110 due to insertion of the output signals S20-S26 read out by the second readout circuit 120.

In some embodiments, the insertion is performed by alternating first digits of the output signals S10-S16 with second digits of the output signals S20-S26. For example, the decoder signal may be generated as a string of digits ordered as: [S10, S20, S11, S21, S12, S22, . . . , S16, S26], where each first digit is followed by the corresponding second digit.

In the example shown in FIG. 8 four readout circuits and four clocks CK1-CK4 are used to perform the method 50. At the rising edge of the first clock CK1, the input signal S0 is at high voltage, whereas the first through sixth signals S1-S6 are at low voltage ([S10:S16]="0000001"). At the rising edge of the second clock CK2, the input signal S0 and the first signal S1 are at high voltage, whereas the second through sixth signals S2-S6 are at low voltage ([S20:S26]="0000011"). At the rising edge of the third clock CK3, the input signal S0 and the first signal S1 are at high voltage, whereas the second through sixth signals S1-S6 are at low voltage ([S30:S36]="0000011"). At the rising edge of the fourth clock CK4, the input signal S0 and the first signal S1 are at high voltage, whereas the second through sixth signals S2-S6 are at low voltage ([S40:S46]="0000011"). Using the method 50, the output signals S10-S16, S20-S26 are decoded to form a decoder signal having value "0000 . . . 000001111111" and width of 28 digits (bits). The decoder signal has quadruple the resolution of the output signals S10-S16 read out by the first readout circuit 110 due to insertion of the output signals S20-S26 read out by the second readout circuit 120, the output signals S30-S36 read out by the third readout circuit, and the output signals S40-S46 read out by the fourth readout circuit.

Figure 9:
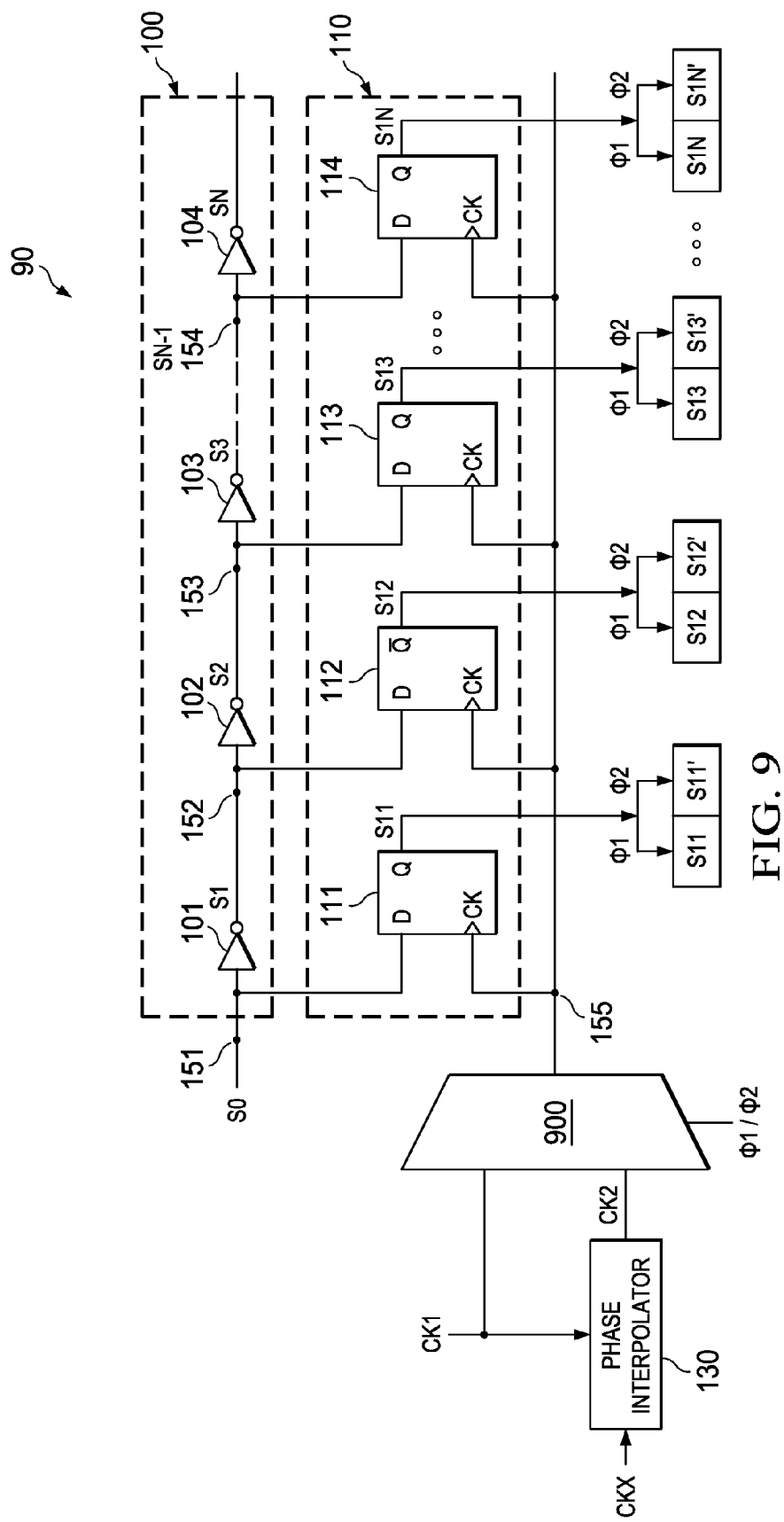
FIG. 9 is a diagram of a TDC circuit in accordance with various embodiments of the present disclosure.
Figure 9A:
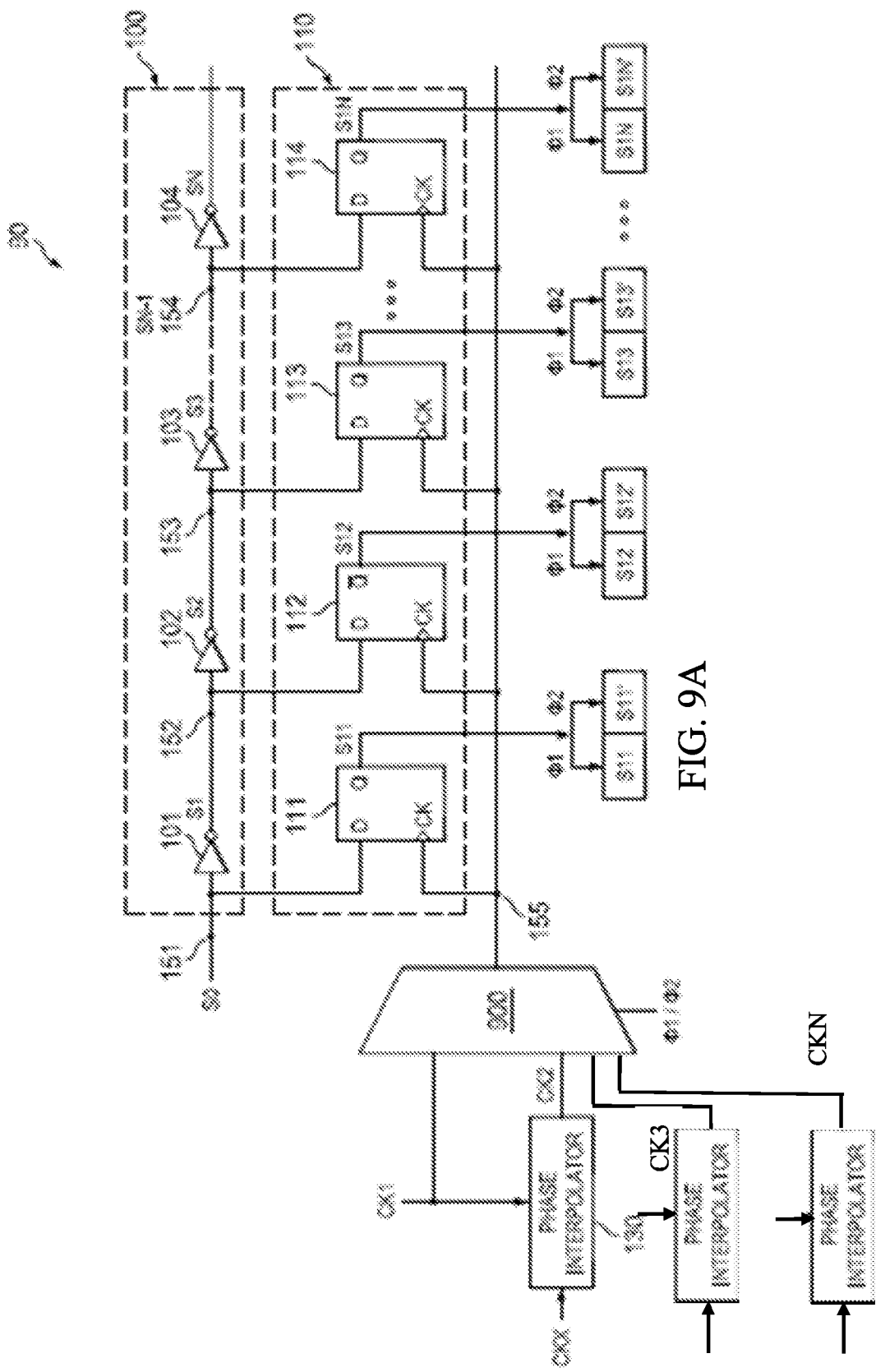
FIG. 9A is an alternate embodiment to that shown in FIG. 9.

FIG. 9 is a diagram of a TDC circuit 90 in accordance with various embodiments of the present disclosure. In some embodiments, the TDC circuit 90 is used with a clock and data recovery (CDR) circuit or a delay-locked loop (DLL) circuit. The TDC circuit 90 shares many features of the TDC circuit 10 of FIG. 1, with like reference numerals referring to like components. In some embodiments, only one readout circuit (the first readout circuit 110) is included in the TDC circuit 90. A multiplexer 900 is also included in the TDC circuit 90. The multiplexer 900 is controlled by a selection signal that has two phases Φ1, Φ2. In the first phase Φ1, the first clock CK1 is outputted from the multiplexer 900 to the clock terminals of the first to Nth flip-flops 111-114 of the first readout circuit 110. In the second phase Φ2, the second clock CK2, which is generated by the phase interpolator 130 based on the first clock CK1 and the interpolator clock CKX, is outputted from the multiplexer 900 to the clock terminals. As a result, odd bits of the decoder signal are generated in the first phase Φ1 at a rising edge of the first clock CK1, and even bits of the decoder signal are generated in the second phase Φ2 at a subsequent rising edge of the second clock CK2 interpolated off of a subsequent rising edge of the first clock CK1. The TDC circuit 90 saves area relative to the TDC circuits 10, 40, but requires at least two clock periods of the first clock CK1 to generate the decoder signal. In some embodiments, further clocks, such as the third through Nth clocks CK3-CKN, are inputted to the multiplexer 900, and the multiplexer 900 selects the first through Nth clocks CK1-CKN sequentially to generate the decoder signal over N clock periods of the first clock CK1. In such embodiments, the TDC circuit 90 includes further phase interpolators electrically connected to input terminals of the multiplexer 900, as illustrated by FIG. 9A.

Figure 9B:
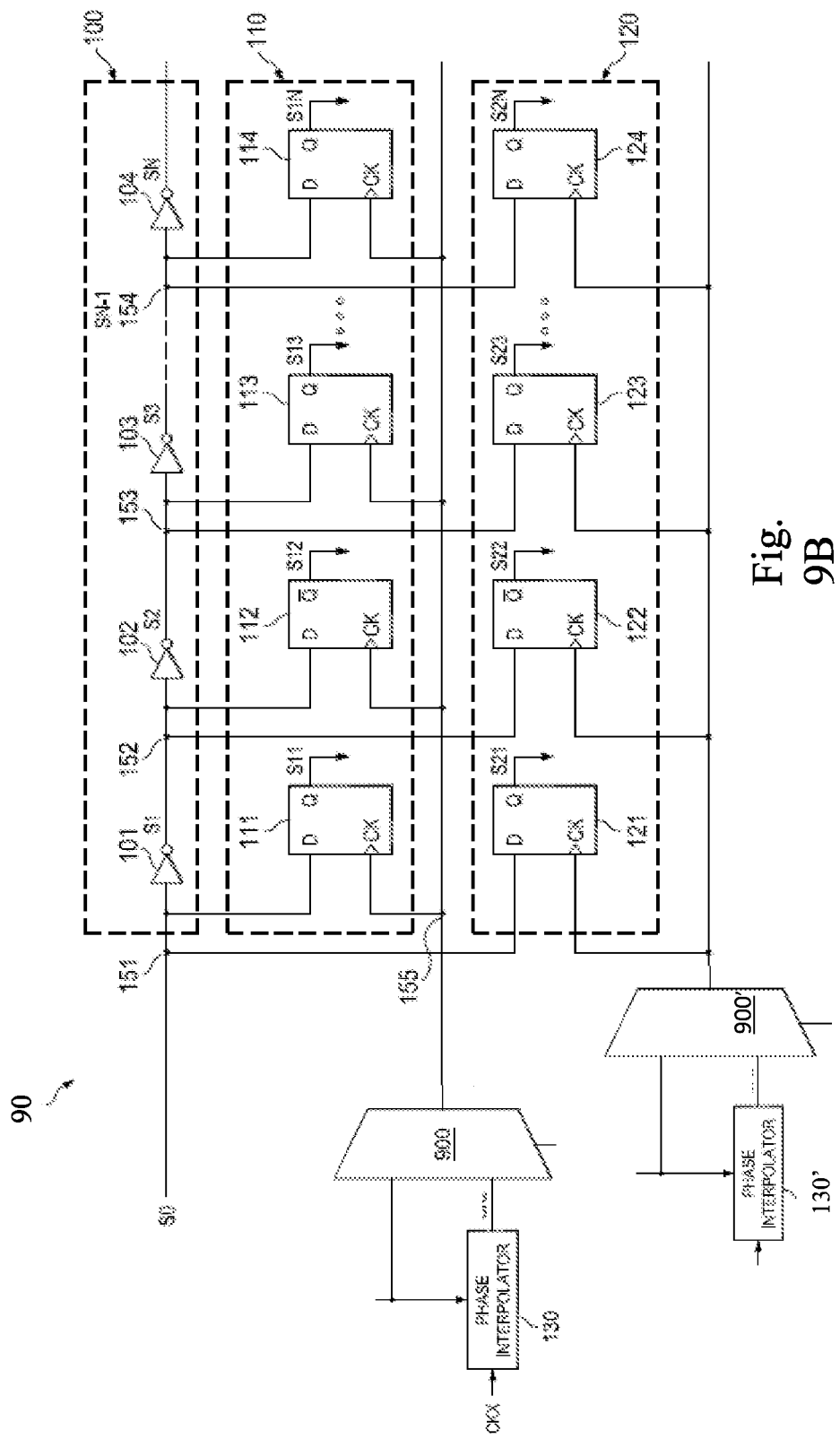
FIG. 9B is another alternate embodiment to that shown in FIG. 9.

In some embodiments, the second readout circuit 120 is included in the TDC circuit 90, and a further multiplexer is electrically connected to the clock terminals of the first through Nth flip-flops 121-124 of the second readout circuit 120, as shown in FIG. 9B. The first through Nth clocks CK1-CKN are split evenly as inputs to the multiplexer 900 and the further multiplexer. For example, the first and second clocks CK1, CK2 are inputted to the multiplexer 900, and the third and fourth clocks CK3, CK4 are inputted to the further multiplexer. In the first phase Φ1, the first clock CK1 is applied to the first readout circuit 110, and the third clock CK3 is applied to the second readout circuit 120. In the second phase Φ2, the second clock CK2 is applied to the first readout circuit 110, and the fourth clock CK4 is applied to the second readout circuit 120. The output signals S11-S1N, S21-S2N of the first and second readout circuits 110, 120 are then decoded to generate the decoder signal. By extension, greater numbers of readout circuits, multiplexers, phase interpolators, and clocks can be arranged as described to generate the decoder signal having finer resolution than provided by a single inverter read by a single readout circuit.

Embodiments may achieve advantages. The second readout circuit 120 and phase interpolator 130 allow the TDC circuit 10 to have double the resolution of the first readout circuit 110. The TDC circuit 40 can have triple, quadruple, or even ten times the resolution of the first readout circuit 110. Increased resolution in the TDC circuits 10, 40, 90 improves system performance of a circuit that uses the TDC circuits 10, 40 or 90, such as an ADPLL, a DLL, or a CDR circuit. Jitter measurement accuracy can also be improved.

In accordance with various embodiments of the present disclosure, a device includes a delay line, a first readout circuit electrically connected to the delay line, a second readout circuit electrically connected to the delay line, and a phase interpolator electrically connected to the second readout circuit.

In accordance with various embodiments of the present disclosure, a device includes a delay line, a readout circuit electrically connected to the delay line, a multiplexer electrically connected to the readout circuit, and a phase interpolator electrically connected to the multiplexer.

In accordance with various embodiments of the present disclosure, a method includes (a) receiving a signal by a delay line; (b) receiving output signals of the delay line by a first readout circuit clocked by a first clock; (c) receiving the output signals of the delay line by a second readout circuit clocked by a second clock having different phase than the first clock; and (d) decoding readout signals of the first and second readout circuits to determine time information of the signal.

As used in this application, "or" is intended to mean an inclusive "or" rather than an exclusive "or". In addition, "a" and "an" as used in this application are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used in either the detailed description or the claims, such terms are intended to be inclusive in a manner similar to the term "comprising". Moreover, the term "between" as used in this application is generally inclusive (e.g., "between A and B" includes inner edges of A and B).

Although the present embodiments and their advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A device comprising:
    a delay line;
    a first readout circuit electrically connected to the delay line;
    a first multiplexer electrically connected to the first readout circuit;
    a second readout circuit electrically connected to the delay line;
    a second multiplexer electrically connected to the second readout circuit; and
    a phase interpolator electrically connected to the first and second multiplexers.

2. The device of claim 1, wherein:
    the delay line comprises an inverter;
    the first readout circuit comprises:
        a first flip-flop having an input terminal electrically connected to an input terminal of the inverter; and
        a second flip-flop having an input terminal electrically connected to an output terminal of the inverter; and
    the second readout circuit comprises:
        a third flip-flop having:
            an input terminal electrically connected to the input terminal of the inverter; and
            a clock terminal electrically connected to an output terminal of the second multiplexer; and
        a fourth flip-flop having:
            an input terminal electrically connected to the output terminal of the inverter; and
            a clock terminal electrically connected to the output terminal of the second multiplexer.

3. The device of claim 1, wherein the phase interpolator comprises:
    a first inverter having an input terminal and an output terminal; and
    a second inverter having an output terminal electrically connected to the output terminal of the first inverter;
    wherein the output terminals of the first and second inverters are electrically connected to clock terminals of the second readout circuit.

4. The device of claim 1, further comprising:
    a second phase interpolator-electrically connected to an input of the second multiplexer.

5. The device of claim 4, wherein:
    the delay line comprises an inverter;
    the first readout circuit comprises:
        a first flip-flop having an input terminal electrically connected to an input terminal of the inverter; and
        a second flip-flop having an input terminal electrically connected to an output terminal of the inverter; and
    the second readout circuit comprises:
        a third flip-flop having:
            an input terminal electrically connected to the input terminal of the inverter; and
            a clock terminal electrically connected to an output terminal of the second multiplexer; and
        a fourth flip-flop having:
            an input terminal electrically connected to the output terminal of the inverter; and
            a clock terminal electrically connected to the output terminal of the second multiplexer.

6. The device of claim 4, wherein:
    the phase interpolator comprises a first inverter and a second inverter;
    the second phase interpolator comprises a third inverter and a fourth inverter; and
    the first inverter and the second inverter are larger than the third inverter and the fourth inverter.

7. A device comprising:
    a delay line;
    a readout circuit electrically connected to the delay line;
    a multiplexer electrically connected to the readout circuit; and
    a phase interpolator electrically connected to the multiplexer.

8. The device of claim 7, wherein:
    the phase interpolator has:
        a first input terminal electrically connected to a first clock generator; and
        a second input terminal electrically connected to a second clock generator; and
    the multiplexer has:
        a first input terminal electrically connected to the first clock generator;
        a second input terminal electrically connected to an output terminal of the phase interpolator; and
        an output terminal electrically connected to clock terminals of the readout circuit.

9. The device of claim 7, wherein:
    the delay line comprises an inverter;
    the readout circuit comprises:
        a first flip-flop having an input terminal electrically connected to an input terminal of the inverter; and
        a second flip-flop having an input terminal electrically connected to an output terminal of the inverter; and
    the multiplexer comprises an output terminal electrically connected to clock terminals of the first and second flip-flops.

10. The device of claim 7, further comprising:
    a second readout circuit electrically connected to the delay line; and
    a second multiplexer electrically connected to the second readout circuit.

11. The device of claim 10, wherein:
    the delay line comprises an inverter;
    the readout circuit comprises:
        a first flip-flop having an input terminal electrically connected to an input terminal of the inverter; and
        a second flip-flop having an input terminal electrically connected to an output terminal of the inverter;
    the multiplexer comprises an output terminal electrically connected to clock terminals of the first and second flip-flops;
    the second readout circuit comprises:
        a third flip-flop having an input terminal electrically connected to an input terminal of the inverter; and
        a fourth flip-flop having an input terminal electrically connected to an output terminal of the inverter; and
    the second multiplexer comprises an output terminal electrically connected to clock terminals of the third and fourth flip-flops.

12. The device of claim 7, further comprising:
a second phase interpolator electrically connected to the multiplexer.

13. A method comprising:
(a) receiving a signal by a delay line;
(b) receiving a first clock signal and an interpolator clock signal and phase interpolating therefrom a second clock signal;
(c) receiving the first clock signal and the second clock signal at a multiplexer and outputting either the first clock signal or the second clock signal in response to a selection signal;
(d) receiving output signals of the delay line by a first readout circuit clocked by the first clock;
e) receiving the output signals of the delay line by a second readout circuit clocked by the second clock signal; and
(f) decoding readout signals of the first and second readout circuits to determine time information of the signal.

14. The method of claim 13, wherein (b) comprises:
receiving the first clock by a first inverter of a phase interpolator;
receiving the interpolator clock signal by a second inverter of the phase interpolator that is smaller than the first inverter; and
generating the second clock by the first inverter and the second inverter.

15. The method of claim 13, wherein (f) comprises:
assigning readout bits of the first readout circuit to odd bits of a decoder signal; and
assigning readout bits of the second readout circuit to even bits of the decoder signal.

16. The method of claim 13, further comprising:
(g) receiving the output signals of the delay line by a third readout circuit clocked by a third clock having different phase than the first and second clocks; and
(h) decoding readout signals of the third readout circuit to determine the time information of the signal.

17. The method of claim 16, further comprising:
(i) generating the second clock by a first phase interpolator having a first size; and
(j) generating the third clock by a second phase interpolator having a second size smaller than the first size.

18. The method of claim 13, wherein:
(d) includes:
  receiving the signal by a first flip-flop of the first readout circuit; and
  receiving an output signal of an inverter receiving the signal by a second flip-flop of the first readout circuit; and
(e) includes:
  receiving the signal by a third flip-flop of the second readout circuit; and
  receiving the output signal of the inverter by a fourth flip-flop of the second readout circuit.

19. The method of claim 13, further comprising outputting the time information to an all-digital phase-locked loop (ADPLL), a clock and data recovery (CDR) circuit, or a delay-locked loop (DLL).

* * * * *